(12) United States Patent
Howland, Jr. et al.

(10) Patent No.: US 7,005,307 B2
(45) Date of Patent: Feb. 28, 2006

(54) APPARATUS AND METHOD FOR DETECTING SOFT BREAKDOWN OF A DIELECTRIC LAYER OF A SEMICONDUCTOR WAFER

(75) Inventors: William H. Howland, Jr., Wexford, PA (US); Robert J. Hillard, Avalon, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 10/878,220

(22) Filed: Jun. 28, 2004

(65) Prior Publication Data

US 2005/0287684 A1   Dec. 29, 2005

(51) Int. Cl.
 *H01L 23/58* (2006.01)
(52) U.S. Cl. .............................. 438/17; 438/14; 257/48
(58) Field of Classification Search .................... None
See application file for complete search history.

(56) References Cited

U.S. PATENT DOCUMENTS

| | | | | |
|---|---|---|---|---|
| 4,891,584 A | * | 1/1990 | Kamieniecki et al. | ...... 324/752 |
| 5,350,944 A | * | 9/1994 | Geis et al. | ...................... 257/77 |
| 5,391,502 A | * | 2/1995 | Wei | .............................. 438/466 |

* cited by examiner

*Primary Examiner*—Ngân V. Ngô
(74) *Attorney, Agent, or Firm*—The Webb Law Firm

(57) ABSTRACT

To detect soft breakdown of a dielectric layer of a semiconductor wafer, a DC current is caused to flow between a top surface of the dielectric layer and the semiconducting material of the semiconductor wafer. The DC current is either a constant value DC current, or a DC current that swept and/or stepped from a first value toward a second value in a manner whereupon the electric field and, hence, a DC voltage induced across the dielectric layer increases as the DC current approaches the second value. The response of the semiconductor wafer to the flow of DC current is measured for the presence of an AC voltage component superimposed on the DC voltage. The value of the DC voltage induced across the dielectric layer where the AC voltage component is detected is designated as the soft breakdown voltage of the dielectric layer.

18 Claims, 2 Drawing Sheets

APPARATUS AND METHOD FOR DETECTING SOFT BREAKDOWN OF A DIELECTRIC LAYER OF A SEMICONDUCTOR WAFER

BACKGROUND OF THE INVENTION

1. Field of the Invention

The present invention relates to semiconductor wafer testing and, more particularly, to determining the occurrence of soft breakdown of a dielectric layer of a semiconductor wafer.

2. Description of Related Art

Soft breakdown of a dielectric layer occurs when leakage current through the dielectric layer exceeds a predetermined threshold value without causing permanent damage to the dielectric layer. This leakage current can be reversed by reducing the bias applied across the dielectric layer. In contrast, hard breakdown of a dielectric layer is an irreversible, catastrophic breakdown of the dielectric layer that occurs when a high value current flows through the dielectric layer in response to the presence of a very high bias applied across the dielectric layer. Heretofore, soft breakdown of a dielectric layer of a semiconductor wafer was determined by mathematically analyzing acquired current-voltage (IV) data and then determining from the acquired data whether soft breakdown had occurred.

What is needed, however, and is not disclosed in the prior art is an apparatus and method for directly determining the occurrence of soft breakdown of a dielectric layer of a semiconductor wafer that avoids having to mathematically analyze acquired data and make a decision as to whether soft breakdown has actually occurred.

SUMMARY OF THE INVENTION

The invention is a method for detecting soft breakdown of a dielectric layer of a semiconductor wafer. The method includes providing a semiconductor wafer comprised of a substrate of semiconducting material having an overlaying dielectric layer. A DC current is caused to flow between the semiconducting material and a surface of the dielectric layer facing away from the semiconducting material. The DC current is either a constant value DC current, or a DC current that is swept or stepped from a first value toward a second value in a manner whereupon an intensity of an electric field induced across the dielectric layer in response to the flow of the DC current increases as the DC current is swept toward the second value. A DC voltage induced across the dielectric layer in response to the flow of the DC current is measured and the presence of an AC voltage superimposed on the measured DC voltage is detected. The value of the measured DC voltage at or near where the AC voltage component is detected is designated as a soft breakdown voltage of the dielectric layer.

The swept or stepped DC current can be dwelled at the value thereof where the AC voltage component is detected. Desirably, the dielectric layer has a thickness of no more than 50 angstroms.

A mercury contact or an electrically conductive probe can be utilized to cause the DC current to flow and to measure the DC voltage induced across the dielectric layer in response to the swept DC current.

The invention is also an apparatus for detecting soft breakdown of a dielectric layer overlaying the semiconducting material of a semiconductor wafer. The apparatus includes a first contact for contacting an exposed surface of the dielectric layer and a second contact for contacting the semiconducting material. Means is provided for causing a constant value DC current, on a swept or stepped DC current to flow between the first and second contacts. Means is provided for measuring a DC voltage induced across the dielectric layer in response to the flow of the DC current. Means is provided for measuring an AC voltage superimposed on the DC voltage. Lastly, means is provided for designating the value of the DC voltage at or near where the AC voltage is superimposed on the DC voltage as a soft breakdown voltage of the dielectric layer.

The first contact can be a mercury contact or an electrically conductive probe. The second contact can include a conductive surface.

Lastly, the invention is a method for detecting soft breakdown of a dielectric layer overlaying the semiconducting material of a semiconductor wafer that includes causing a constant value DC current, or a swept or stepped DC current to flow between the semiconducting material and surface of the dielectric layer opposite the semiconducting material. A DC voltage induced across the dielectric layer in response to the flow of DC current is measured and an AC voltage on the DC voltage is detected. The value of the DC voltage on or near where the AC voltage is detected on the DC voltage is output as a soft breakdown value of the dielectric layer.

DETAILED DESCRIPTION OF THE INVENTION

The present invention will be described with reference to the accompanying figures where like reference number correspond to like elements.

Figure 1:
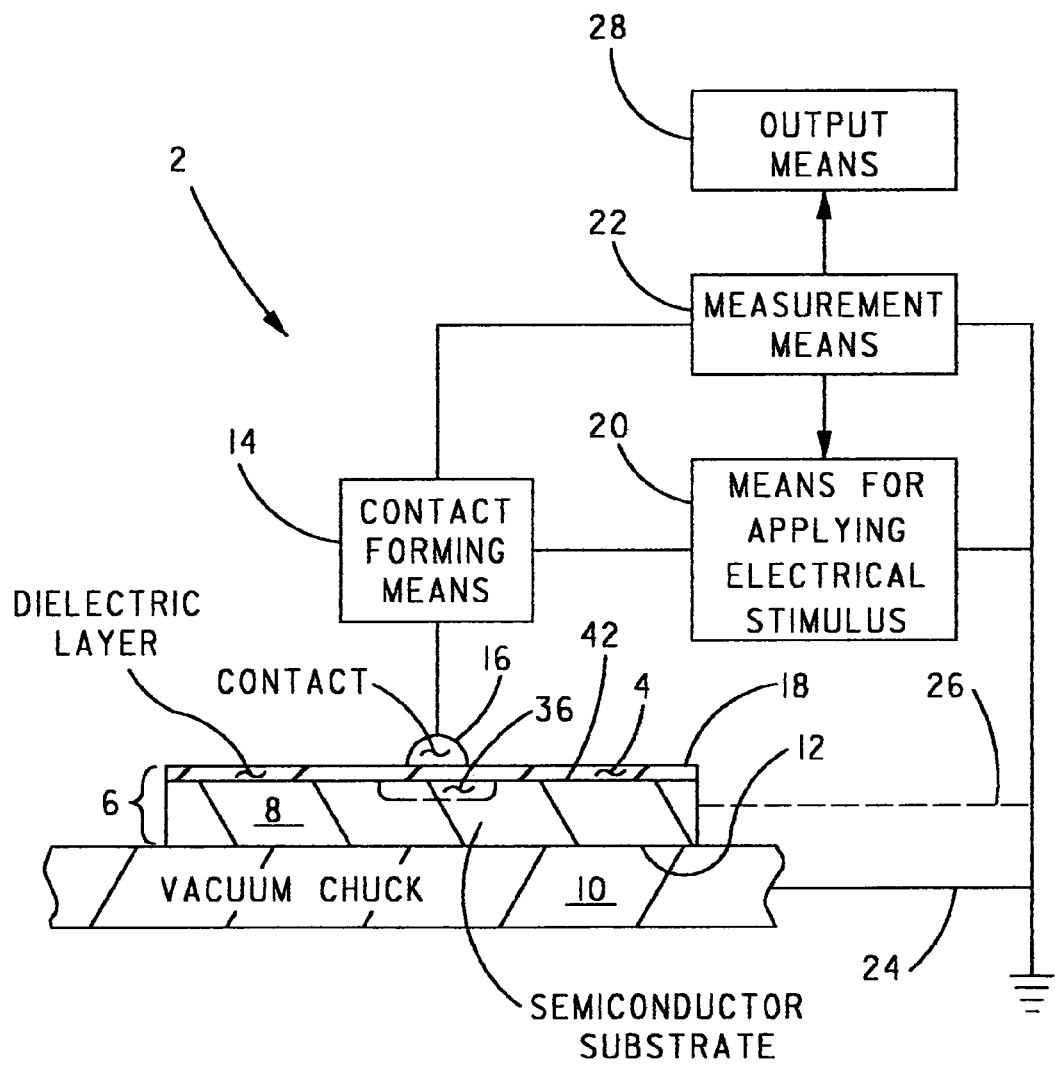
FIG. 1 is a cross-sectional side view of a semiconductor wafer having a dielectric layer overlaying a semiconductor substrate coupled to a block diagram of an apparatus for testing the semiconductor wafer.

With reference to FIG. 1, an apparatus 2 for detecting soft breakdown of a dielectric layer 4 of a semiconductor wafer 6 having a substrate 8 formed from semiconducting material includes a vacuum chuck 10, desirably electrically conductive, having a surface for holding a backside 12 of wafer 6 by means of a vacuum (not shown). Apparatus 2 also includes a contact forming means 14 for causing a contact 16 to touch a surface or topside 18 of wafer 6. As shown in FIG. 1, topside 18 is the exposed surface of dielectric layer 4 that overlays semiconductor substrate 8 of semiconductor wafer 6. Contact 16 can be a probe, like the one disclosed in U.S. Pat. No. 6,492,827 to Mazur et al. which is incorporated herein by reference, or a Mercury (Hg) contact, the use of which is well know to those of ordinary skill in the art. The disclosure of contact 16 being a probe or a Hg contact, however, is not to be construed as limiting the invention.

Apparatus 2 further includes a means for applying electrical stimulus 20 and a measurement means 22, both of which are electrically connected to contact 16 either directly or via contact forming means 14. Means for applying electrical stimulus 20 and measurement means 22 are also electrically connected to semiconductor substrate 8 via vacuum chuck 10, as shown by solid line 24 in FIG. 1, or directly to semiconductor substrate 8, as shown by dashed line 26 in FIG. 1. Contact 16 defines a first contact of apparatus 2 while the connection of means for applying electrical stimulus 20 and measurement means 22 to semiconductor substrate 8, either directly or via vacuum chuck 10, defines a second contact of apparatus 2.

Lastly, apparatus 2 includes an output means 28 for outputting in human detectable form an indication of a value output by measurement means 22 to output means 28. Output means 28 can be any one or a combination of a visual output device, such as a CRT, a printer, an array of lamps, etc., for outputting a visual indication of the value received from measurement means 22, and/or an audio output device for outputting an audible signal or message indicative of the value received from measurement means 22. These output devices, however, are not to be construed as limiting the invention.

Figure 2A:
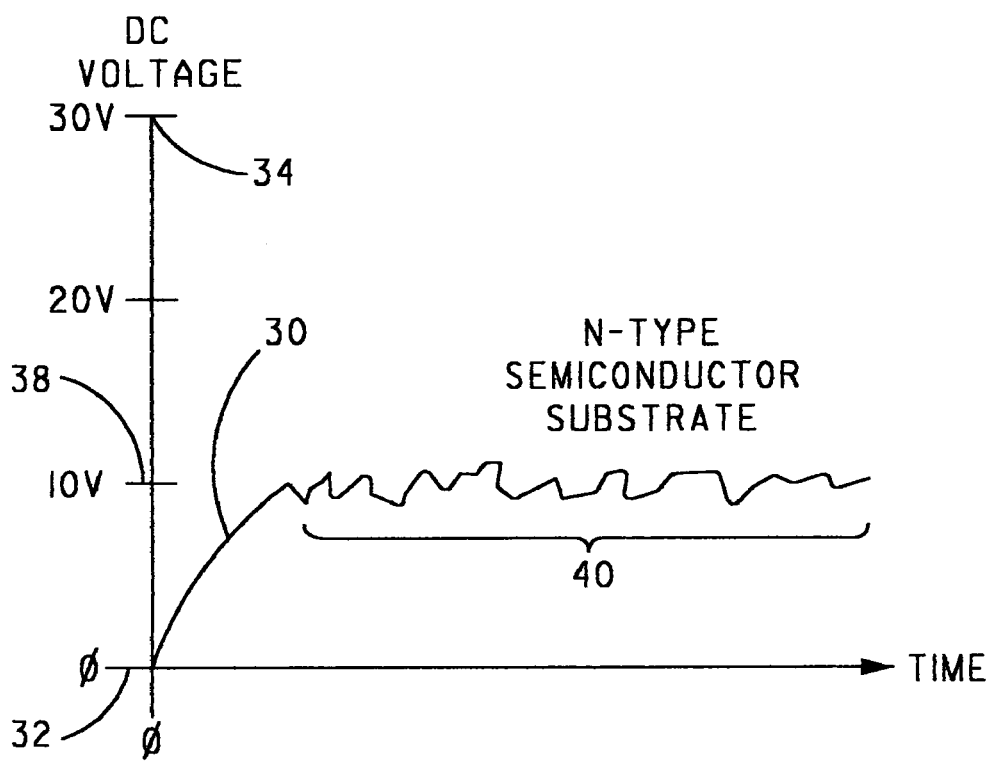
FIGS. 2a and 2b are plots of voltage versus time for the dielectric layer shown in FIG. 1 formed from N-type and P-type semiconducting material, respectively, showing the voltage induced across the dielectric layer in response to a changing current flowing thereacross.
Figure 2B:
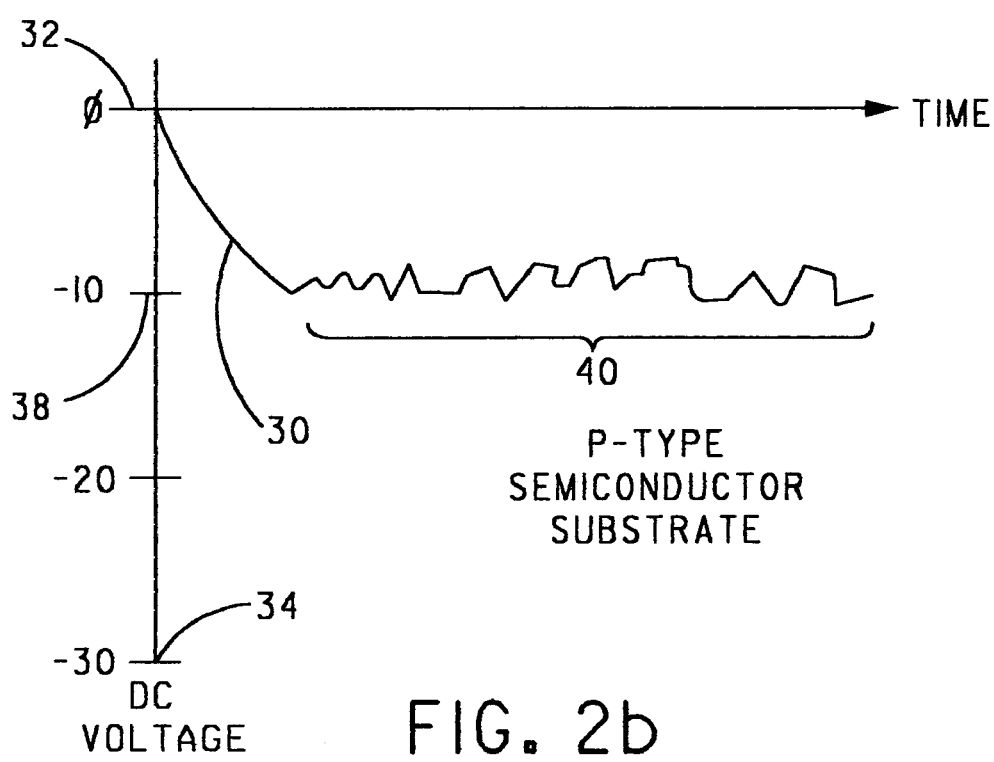

With reference to FIGS. 2a and 2b, and with continuing reference to FIG. 1, at a suitable time when contact 16 is touching topside 18, means for applying electrical stimulus 20 causes a DC current to flow between semiconductor substrate 8 and topside 18 of dielectric layer 4 via semiconductor substrate 8 and contact 16, and measurement means 22 measures a DC voltage 30 induced across dielectric layer 4 in response to the flow DC current.

The DC current can be swept and/or stepped from a first value toward a second value in a manner whereupon an intensity of an electric field induced across the dielectric layer in response thereto increases in value as the DC current approaches the second value. This increase in electric field causes DC voltage 30 to increase in value from a first voltage 32 toward a second voltage 34.

This increase in the intensity of the electric field and, hence, DC voltage 30 is caused by an increase in the accumulation of majority carriers in a region 36 of semiconductor substrate 8 (see FIG. 1) adjacent an interface 42 between dielectric layer 4 and semiconductor substrate 8 in alignment with contact 16. As an example, for semiconductor substrate 8 formed from N-type material, the majority carriers are electrons and the DC current is desirably swept and/or stepped from a first, starting value, e.g., zero (0) amps, toward a positive second value, e.g., $10^{-5}$ amps. For a semiconductor substrate formed from P-type material, the majority carriers are holes and the DC current is desirably swept from a first starting value, e.g., zero (0) amps, toward a negative second value, e.g., $-10^{-5}$ amps. The foregoing first and second values, however, are not to be construed as limiting the invention. Moreover, for reasons discussed hereinafter, the differences between the first and the second values of current for the N-type and the P-type semiconductor substrates are not to be construed as limiting the invention.

During the sweeping or stepping of the DC current from its first value toward its second value, measurement means 22 samples DC voltage 30 via contact 16 and semiconductor substrate 8. It has been observed that when dielectric layer 4 of semiconductor wafer 6 has a thickness of 50 angstroms or less, and the measured DC voltage 30 reaches a threshold value 38 between first voltage 32 and second voltage 34, an AC voltage component 40 will become superimposed on DC voltage 30. This AC voltage component 40 will typically have an amplitude between 5 and 200 mV. However, this is not to be construed as limiting the invention.

It is believed that AC voltage component 40 results from tunneling current flowing through dielectric layer 4 when DC voltage 30 reaches threshold value 38. It is believed that threshold value 38 is related to a number of factors including, without limitation, the thickness of dielectric layer 4, the number of majority carriers in region 36, and the size of contact 16 on topside 18 of wafer 6. However, these factors are not to be construed as limiting the invention.

More specifically, as the DC current is swept and/or stepped from its first value toward its second value, majority carriers accumulate in region 36. When a sufficient number of majority carriers accumulate in region 36 whereupon the value of DC voltage 30 equals or exceeds threshold voltage 38, a tunneling current flows between contact 16 and region 36. This tunneling current initially causes a small decrease in the value of DC voltage 30, e.g., between 5 and 200 mV, measured by measurement means 22. In response to the flow of tunneling current and the corresponding small decrease in the value of DC voltage 30, the tunneling current diminishes or ceases whereupon additional majority carriers are drawn into region 36 thereby causing the value of DC voltage 30 to increase. Provided that dielectric layer 4 is not irrecoverably damaged, e.g., by an electric arc between contact 16 and region 36, this change in the value of DC voltage 30 continues as long as its value equals or exceeds threshold value 38.

The flow of tunneling current and the subsequent drawing of additional majority carriers into region 36, i.e., the change in the value of DC voltage 30, can be detected by measurement means 22 as AC voltage component 40 superimposed on DC voltage 30 (see FIGS. 2a and 2b). Once AC voltage component 40 is initially detected, measurement means 22 can cause means for applying electrical stimulus 20 to cause DC voltage 30 to dwell at threshold value 38. During the dwell of DC voltage 30 at threshold value 38, measurement means 22 can determine if AC voltage component 40 continues unabated for a predetermined interval. If so, measurement means 22 assumes that AC voltage component 40 is due to "soft breakdown" of dielectric layer 4 and not due to a spurious noise event.

Threshold value 38 where the onset of AC voltage component 40 initially occurs can be designated by measurement means 22 as the soft breakdown voltage of dielectric layer 4. This soft breakdown voltage value can be output by measurement means 22 to output means 28 for conversion into a human detectable form.

Alternatively, a constant value DC current can be caused to flow between semiconductor substrate 8 and topside 18 of dielectric layer 4 whereupon threshold value 38 of DC voltage 30 is induced across dielectric layer 4 and AC voltage component 40 is superimposed on DC voltage 30. If AC voltage component 40 superimposed on DC voltage 30 in response to a constant value DC current flowing between semiconductor substrate 8 and topside 18 continues unabated for a predetermined interval, measurement means 22 assumes that AC voltage component 40 is due to "soft breakdown" of dielectric layer 4. This soft breakdown voltage value can be output by measurement means 22 to output means 28 for conversion into a human detectable form.

The above described ways of causing threshold value 38 to be induced, i.e., the DC current is swept or stepped to a value that causes threshold value 38 to be induced, or a constant value DC current is applied that causes threshold value 38 to be induced, are not to be construed as limiting the invention since the use of any manner of causing threshold value 38 to be induced between semiconductor substrate 8 and topside 18 of dielectric layer 4 whereupon AC voltage component 40 is superimposed on threshold value 38 of DC voltage 30 is envisioned.

As can be seen, the present invention enables the soft breakdown voltage of dielectric layer 4 to be determined by detecting where AC voltage component 40 becomes superimposed on DC voltage 30. This ability to detect the soft breakdown voltage of dielectric layer 4 avoids the need to mathematically analyze acquired IV (current-voltage) data and then make a decision as to whether soft breakdown has occurred.

The invention has been described with reference to the preferred embodiment. Obvious modifications and alterations will occur to others upon reading and understanding the preceding detailed description. For example, while DC voltage 30 and AC voltage component 40 have been described, it is envisioned that a DC current, an AC current, or some combination of AC and/or DC voltages and/or currents can be utilized. It is intended that the invention be construed as including all such modifications and alterations insofar as they come within the scope of the appended claims or the equivalents thereof.

The invention claimed is:

1. A method for detecting soft breakdown of a dielectric layer of a semiconductor wafer comprising:
   (a) providing a semiconductor wafer comprised of a substrate of semiconducting material having an overlaying dielectric layer;
   (b) causing a DC current to flow between the semiconducting material and a surface of the dielectric layer facing away from the semiconducting material;
   (c) measuring a DC voltage induced across the dielectric layer in response to the flow of the DC current;
   (d) detecting for the presence of an AC voltage superimposed on the measured DC voltage; and
   (e) designating the value of the measured DC voltage at or near where the AC voltage component is detected as a soft breakdown voltage of the dielectric layer.

2. The method of claim 1, further including sweeping or stepping the DC current from a first value toward a second value in a manner whereupon an intensity of an electric field induced across the dielectric layer in response to the flow of the DC current increases as the DC current is swept toward the second value.

3. The method of claim 2, further including dwelling the swept or stepped DC current at the value thereof where the AC voltage component is detected.

4. The method of claim 1, wherein the DC current is a constant value DC current.

5. The method of claim 1, wherein the dielectric layer has a thickness of no more than 50 angstroms.

6. The method of claim 1, wherein one of a mercury contact and an electrically conductive probe is utilized to cause the DC current to flow and to measure the DC voltage induced across the dielectric layer in response to the flow of DC current.

7. An apparatus for detecting soft breakdown of a dielectric layer overlaying the semiconducting material of a semiconductor wafer comprising:
   a first contact for contacting an exposed surface of the dielectric layer;
   a second contact for contacting the semiconducting material;
   means for causing a DC current to flow between the first and second contacts;
   means for measuring a DC voltage induced across the dielectric layer in response to the flow of the DC current;
   means for measuring an AC voltage superimposed on the DC voltage; and
   means for designating the value of the DC voltage at or near where the AC voltage is superimposed on the DC voltage as a soft breakdown voltage of the dielectric layer.

8. The apparatus of claim 7, further including means for sweeping or stepping the value of the DC current.

9. The apparatus of claim 7, wherein the dielectric layer has a thickness of no more than 50 angstroms.

10. The apparatus of claim 7, wherein the first contact comprises one of a mercury contact and an electrically conductive probe.

11. The apparatus of claim 7, wherein the second contact comprises a conductive surface.

12. The apparatus of claim 7, wherein the DC current is a constant value DC current.

13. A method for detecting soft breakdown of a dielectric layer overlaying the semiconducting material of a semiconductor wafer comprising:
   (a) causing a DC current to flow between the semiconducting material and surface of the dielectric layer opposite the semiconducting material;
   (b) measuring a DC voltage induced across the dielectric layer in response to the flow of DC current;
   (c) detecting an AC voltage on the DC voltage; and
   (d) outputting the value of the DC voltage on or near where the AC voltage is detected on the DC voltage as a soft breakdown value of the dielectric layer.

14. The method of claim 13, further including sweeping or stepping the value of the DC current.

15. The method of claim 13, wherein the dielectric layer has a thickness of no more than 50 angstroms.

16. The method of claim 13, wherein the first contact comprises one of a mercury contact and an electrically conductive probe.

17. The method of claim 13, wherein the second contact comprises a conductive surface.

18. The method of claim 13, wherein the DC current is a constant value DC current.

* * * * *